(12) United States Patent
Lee et al.

(10) Patent No.: US 12,237,024 B2
(45) Date of Patent: Feb. 25, 2025

(54) MEMORY DEVICE AND PROGRAMMING METHOD THEREOF

(71) Applicant: MACRONIX International Co., Ltd., Hsinchu (TW)

(72) Inventors: Kun-Tse Lee, Hsinchu County (TW); Han-Sung Chen, Hsinchu (TW); Shih-Chang Huang, Penghu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 224 days.

(21) Appl. No.: 17/894,838

(22) Filed: Aug. 24, 2022

(65) Prior Publication Data

US 2024/0071523 A1    Feb. 29, 2024

(51) Int. Cl.
| | |
|---|---|
| *G11C 16/08* | (2006.01) |
| *G11C 16/10* | (2006.01) |
| *G11C 16/28* | (2006.01) |
| *G11C 16/34* | (2006.01) |

(52) U.S. Cl.
CPC .......... *G11C 16/3459* (2013.01); *G11C 16/08* (2013.01); *G11C 16/102* (2013.01); *G11C 16/28* (2013.01)

(58) Field of Classification Search
CPC ... G11C 16/3459; G11C 16/08; G11C 16/102; G11C 16/28
USPC ................................... 365/185.22
See application file for complete search history.

(56) References Cited

U.S. PATENT DOCUMENTS

| | | | |
|---|---|---|---|
| 2015/0262700 A1 | 9/2015 | Yoon et al. | |
| 2015/0348633 A1* | 12/2015 | Song ................... | G11C 11/5628 |
| | | | 365/185.19 |
| 2017/0125118 A1 | 5/2017 | Lee et al. | |
| 2022/0113892 A1* | 4/2022 | Fugazza ................ | H10B 63/84 |

FOREIGN PATENT DOCUMENTS

| | | |
|---|---|---|
| TW | I483253 | 5/2015 |
| TW | I685742 | 2/2020 |

OTHER PUBLICATIONS

"Office Action of Taiwan Counterpart Application", issued on Jun. 15, 2023, pp. 1-4.

* cited by examiner

*Primary Examiner* — Alfredo Bermudez Lozada
*Assistant Examiner* — Tracy Hampton
(74) *Attorney, Agent, or Firm* — J.C. PATENTS

(57) ABSTRACT

A memory device and a programming method thereof are provided. The programming method includes the following steps. According to a step value, based on an incremental step pulse programming scheme, multiple programming operations are performed for a selected memory page. In a setting mode, multiple program verify operations are respectively performed corresponding to the programming operations to respectively generate multiple pass bit numbers. In the setting mode, a pass bit number difference value of two pass bit numbers corresponding to two programming operations is calculated. In the setting mode, an amount of the step value is adjusted according to the pass bit number difference value.

19 Claims, 11 Drawing Sheets

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | |
|---|---|---|---|---|---|---|---|---|---|---|---|---|---|---|---|---|---|---|---|---|---|---|---|---|---|
| G | 1 | | | | | | | | | | | | 1 | 1 | 1 | 1 | 1 | 1 | 1 | 1 | 1 | | | | |
| F | 1 | | | | | | | | | | | | 1 | 1 | 1 | 1 | 1 | 1 | 1 | 1 | | | | | |
| E | 1 | | | | | | | | | | | | | | 1 | 1 | 1 | 1 | | | | | | | |
| D | 1 | | | | | | | 1 | 1 | 1 | 1 | 1 | 1 | 1 | 1 | | | | | | | | | | |
| C | 1 | | | | | 1 | 1 | 1 | 1 | 1 | 1 | 1 | | | | | | | | | | | | | |
| B | 1 | | 1 | 1 | 1 | 1 | 1 | | | | | | | | | | | | | | | | | | |
| A | 1 | 1 | 1 | | | | | | | | | | | | | | | | | | | | | | |
| | A | A | AB | AB | ABC | ABC | BCD | BCD | BCDE | CDE | CDEF | CDEF | DEFG | DEFG | DEFG | EFG | EFG | EFG | FG | FG | FG | G | G | G | |

MEMORY DEVICE AND PROGRAMMING METHOD THEREOF

BACKGROUND

Technical Field

The disclosure relates to a memory device and a programming method thereof, and in particular to a memory device capable of dynamically adjusting a programming voltage pulse and a programming method thereof.

Description of Related Art

In non-volatile memory devices, especially in the three-dimensional stacked memory cell structure, the threshold voltage distribution of memory cells and the performance of a programming operation are affected by many factors, such as electrical characteristics, program/erase cycle, drift of process parameters, and temperature. Therefore, in the incremental step pulse programming scheme, it is difficult to take into account the density of the threshold voltage distribution of the memory cells and the speed of the programming operation through the programming operation with a fixed step value, and a high-efficiency programming operation cannot be provided.

SUMMARY

The disclosure provides a memory device and a programming method thereof, which can improve the performance of a programming operation.

The programming method of the disclosure is applicable to a memory device. The programming method includes the following steps. According to a step value, based on an incremental step pulse programming scheme, multiple programming operations are performed on a selected memory page. In a setting mode, multiple program verify operations are respectively performed corresponding to the programming operations to respectively generate multiple pass bit numbers. In the setting mode, a pass bit number difference value of two pass bit numbers corresponding to two programming operations is calculated. In the setting mode, an amount of the step value is adjusted according to the pass bit number difference value.

The memory device of the disclosure includes a memory cell array and a controller. The memory cell array includes multiple memory blocks, and each memory block has multiple memory pages. The controller is coupled to the memory cell array and is configured to execute the following. In a setting mode, multiple program verify operations are respectively performed corresponding to multiple programming operations to respectively generate multiple pass bit numbers. In the setting mode, a pass bit number difference value of two pass bit numbers corresponding to two programming operations is calculated. In the setting mode, an amount of a step value is adjusted according to the pass bit number difference value.

Based on the above, the controller of the disclosure performs an adjustment operation of the step value in the incremental step pulse programming scheme according to the pass bit number difference value of the two pass bit numbers corresponding to the two programming operations. In this way, without the need to apply complex logical operations, the programming voltage pulse can be adjusted adaptively, which effectively improves the benefit of the programming operation of the memory device.

BRIEF DESCRIPTION OF THE DRAWINGS

FIG. 4A to FIG. 4C are a diagrams of a relationship between a programming operation and a program verify operation according to an embodiment of the disclosure.

DETAILED DESCRIPTION OF DISCLOSED EMBODIMENTS

Figure 1:
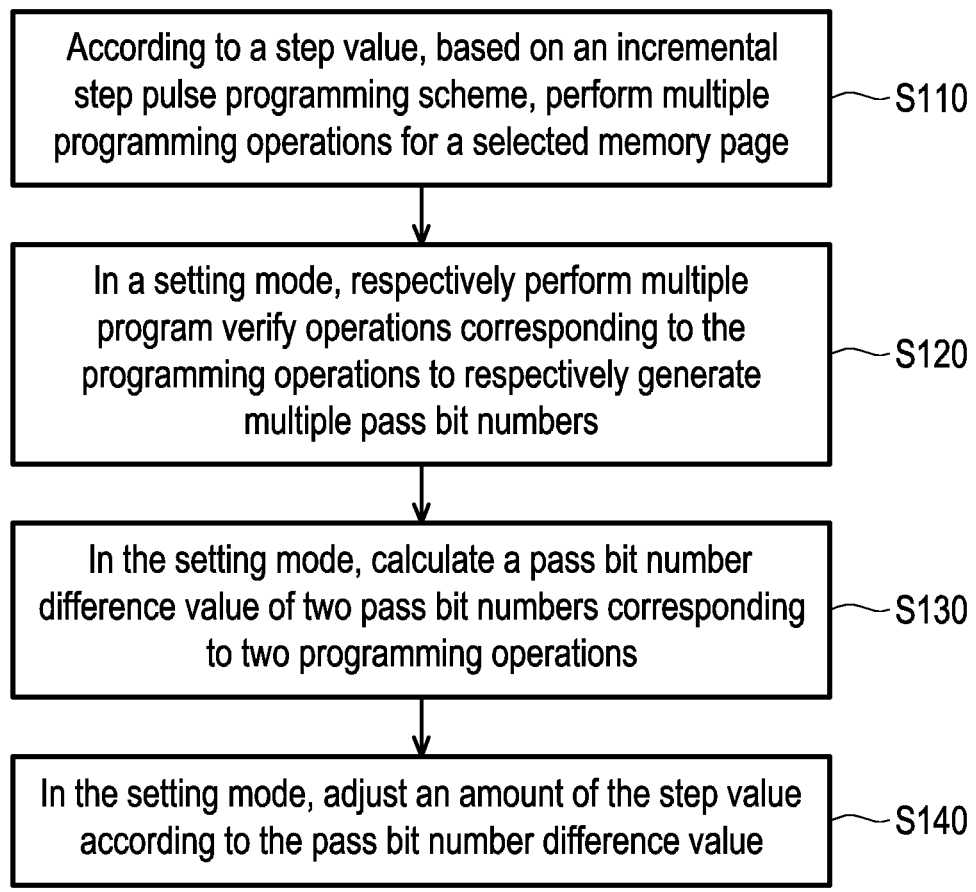
FIG. 1 is a flowchart of a programming method according to an embodiment of the disclosure.

Please refer to FIG. 1. FIG. 1 is a flowchart of a programming method according to an embodiment of the disclosure. The programming method of the embodiment of FIG. 1 is applicable to a memory device, such as a flash memory device. The programming method includes the following steps. In Step S110, according to a step value, based on an incremental step pulse programming (ISPP) scheme, multiple programming operations are performed for a selected memory page in the memory device. In the embodiment, each of the programming operations refers to providing a programming voltage pulse for a word line of a memory cell of the selected memory page. In the incremental step pulse programming scheme, with each of the programming operations, the voltage value of the programming voltage pulse may be sequentially increased according to the set step value.

Next, in Step S120, in a setting mode, multiple program verify operations are respectively performed corresponding to the programming operations to respectively generate multiple pass bit numbers through the program verify operations. In order to confirm whether a threshold voltage of all memory cells is programmed to a set voltage value in each of the programming operations, the corresponding program verify operation may be performed after each of the programming operations. When the programming operations are performed for multiple memory cells, the corresponding program verify operation is performed after each of the programming operations, and the current number of pass bits, that is, the pass bit number in the memory cells may be calculated.

Further, in Step S130, in the setting mode, a pass bit number difference value of two pass bit numbers corresponding to two programming operations may be calculated.

Moreover, in Step S140, an amount of the step value is adjusted according to the pass bit number difference value.

Please note here that when the pass bit number difference value of the two pass bit numbers corresponding to the two programming operations is too small, it means that the energy of the programming voltage pulse may be insufficient, causing the production rate of the memory cells changed to the pass bits to be too low. Under such condition, in Step S140, the step value may be adjusted to increase the amount of increase of the energy of the programming voltage pulse, which can speed up the overall programming operation.

On the contrary, when the pass bit number difference value of the two pass bit numbers corresponding to the two programming operations is too large, it means that the energy of the programming voltage pulse is too high. Such situation causes the production rate of the memory cells changed to the pass bits to be too high, and causes the threshold voltage distribution of the memory cells of the pass bits to be too divergent. Under such condition, in Step S140, the step value may be decreased to increase the amount of increase of the energy of the programming voltage pulse, which can concentrate the threshold voltage distribution of the memory cells of the pass bits.

In terms of the specific operation, in Step S140, the pass bit number difference value may be compared with a preset first threshold value and second threshold value, wherein the first threshold value is greater than or equal to the second threshold value. When the pass bit number difference value is greater than or equal to the first threshold value, the step value may be decreased. On the contrary, when the pass bit number difference value is less than the second threshold value, the step value may be increased.

Incidentally, when the pass bit number difference value is smaller than the first threshold value and greater than the second threshold value, an adjustment operation of the step value is not performed.

It is worth noting that the first threshold value and the second threshold value may be set by a designer according to process parameters of the memory cells, electrical characteristics, and application fields and requirements of the memory device, and there is no particular limitation.

Figure 2A:
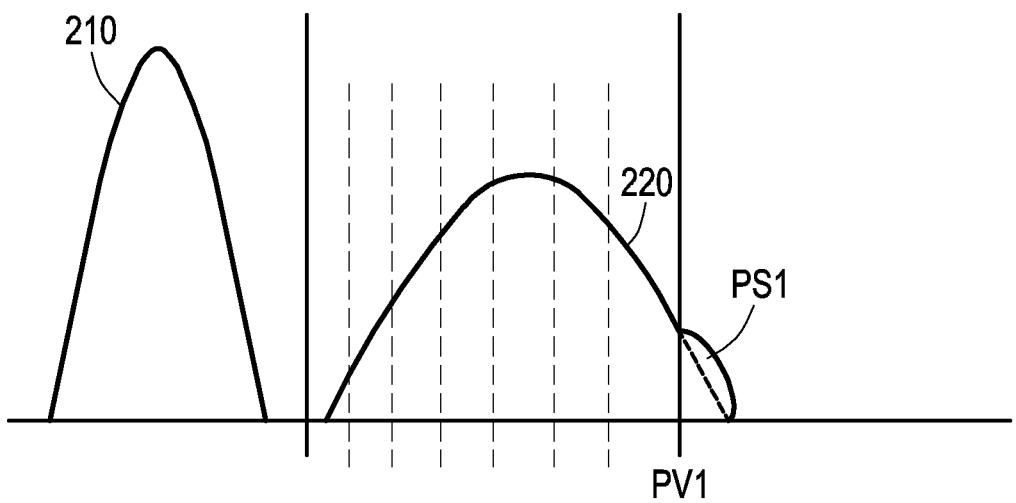
FIG. 2A to FIG. 2D are schematic diagrams of operations of a programming method of a memory device according to an embodiment of the disclosure.

Please refer to FIG. 2A to FIG. 2D below, wherein FIG. 2A to FIG. 2D are schematic diagrams of operations of a programming method of a memory device according to an embodiment of the disclosure. In FIG. 2A to FIG. 2D, the horizontal axis represents voltage and the vertical axis represents the number of memory cells. In FIG. 2A, a distribution curve 210 is the corresponding distribution of the threshold voltage and the number of memory cells in an erased state in the selected memory page. A distribution curve 220 is the corresponding distribution of the threshold voltage and the number of memory cells performing the programming operations in the selected memory page.

In the embodiment, when one programming operation is performed for the memory cell, one programming voltage pulse may be provided for the word line of the memory cell, and the above operation may also be referred to as one shot. In FIG. 2A, the distribution curve 220 may be, for example, a state generated after performing a second shot for multiple programmed memory cells. In the incremental step pulse programming scheme, the programming voltage pulse may be sequentially incremented with each applied shot according to the step value.

By performing the program verify operations on the programmed memory cells, and comparing the threshold voltage of the programmed memory cells with a verifying voltage PV1 (that is, comparing the distribution curve 220 with the verifying voltage PV1), a pass bit number PS1 that completes the programming operation in the programmed memory cells at this time may be obtained. The pass bit number PS1 may be an area of a region where the threshold voltage is greater than the verifying voltage PV1 in the distribution curve 220.

Figure 2B:
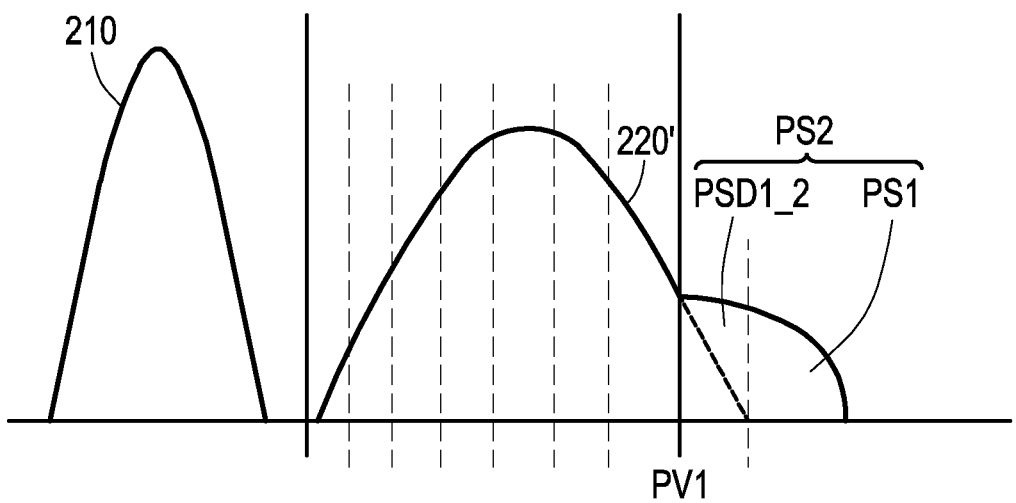

Next, in FIG. 2B, a third shot is applied to the programmed memory cells to obtain a new distribution curve 220', wherein the programming voltage pulse of the third shot may be greater than the programming voltage pulse of the second shot by one step value. By comparing the distribution curve 220' with the verifying voltage PV1 to perform the corresponding program verify operation, a pass bit number PS2 that completes the programming operation in the programmed memory cells at this time may be obtained. Further, by subtracting the pass bit number PS2 and PS1, a pass bit number difference value PSD1_2 between the second shot and the third shot may be generated.

In the embodiment, by comparing the pass bit number difference value PSD1_2 with the first threshold value and the second threshold value, whether to adjust the step value may be determined. The first threshold value is greater than the second threshold value. When the pass bit number difference value PSD1_2 is greater than the first threshold value, the step value may be decreased. On the contrary, when the pass bit number difference value PSD1_2 is less than the second threshold value, the step value may be increased. If the pass bit number difference value PSD1_2 is between the first threshold value and the second threshold value, the step value is not adjusted.

Figure 2C:
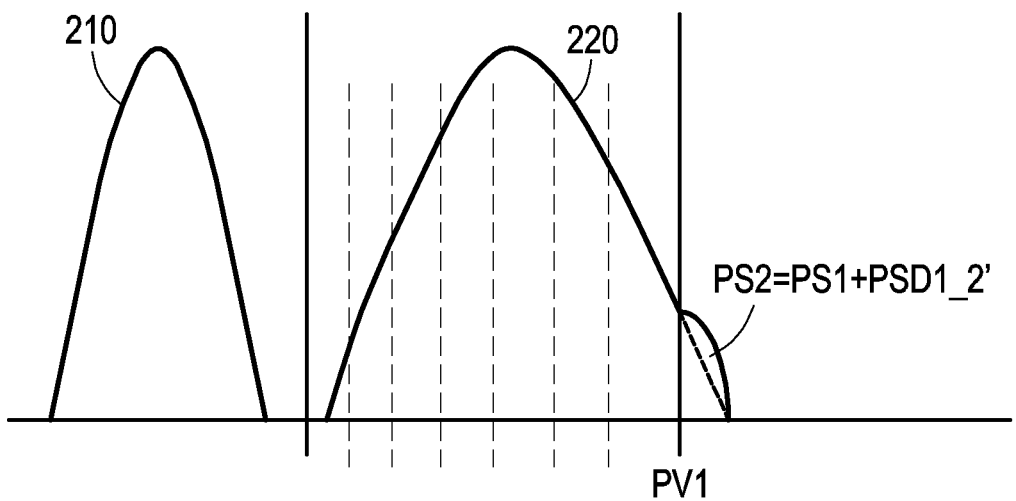

For example, in FIG. 2C, the pass bit number difference value PSD1_2' is smaller than the first threshold value and greater than the second threshold value, so the step value may maintain the original value.

Figure 2D:
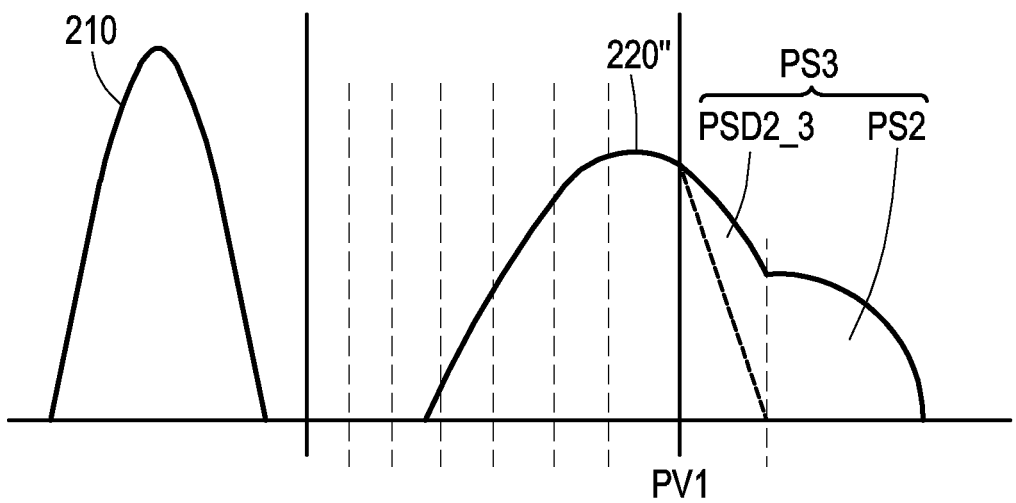

In FIG. 2D, a fourth shot is then applied to the programmed memory cells to obtain a new distribution curve 220". By comparing the distribution curve 220" with the verifying voltage PV1 to perform the corresponding program verify operation, a pass bit number PS3 that completes the programming operation in the programmed memory cells at this time can be obtained. Further, by subtracting the pass bit numbers PS3 and PS2, a pass bit number difference value PSD2_3 between the third shot and the fourth shot may be generated.

Similarly, the pass bit number difference value PSD2_3 is compared with the first threshold value and the second threshold value and is used as the basis for adjusting the step value. In the embodiment, the pass bit number difference value PSD2_3 is, for example, greater than or equal to the first threshold value, so the step value may be decreased correspondingly.

Figure 3:
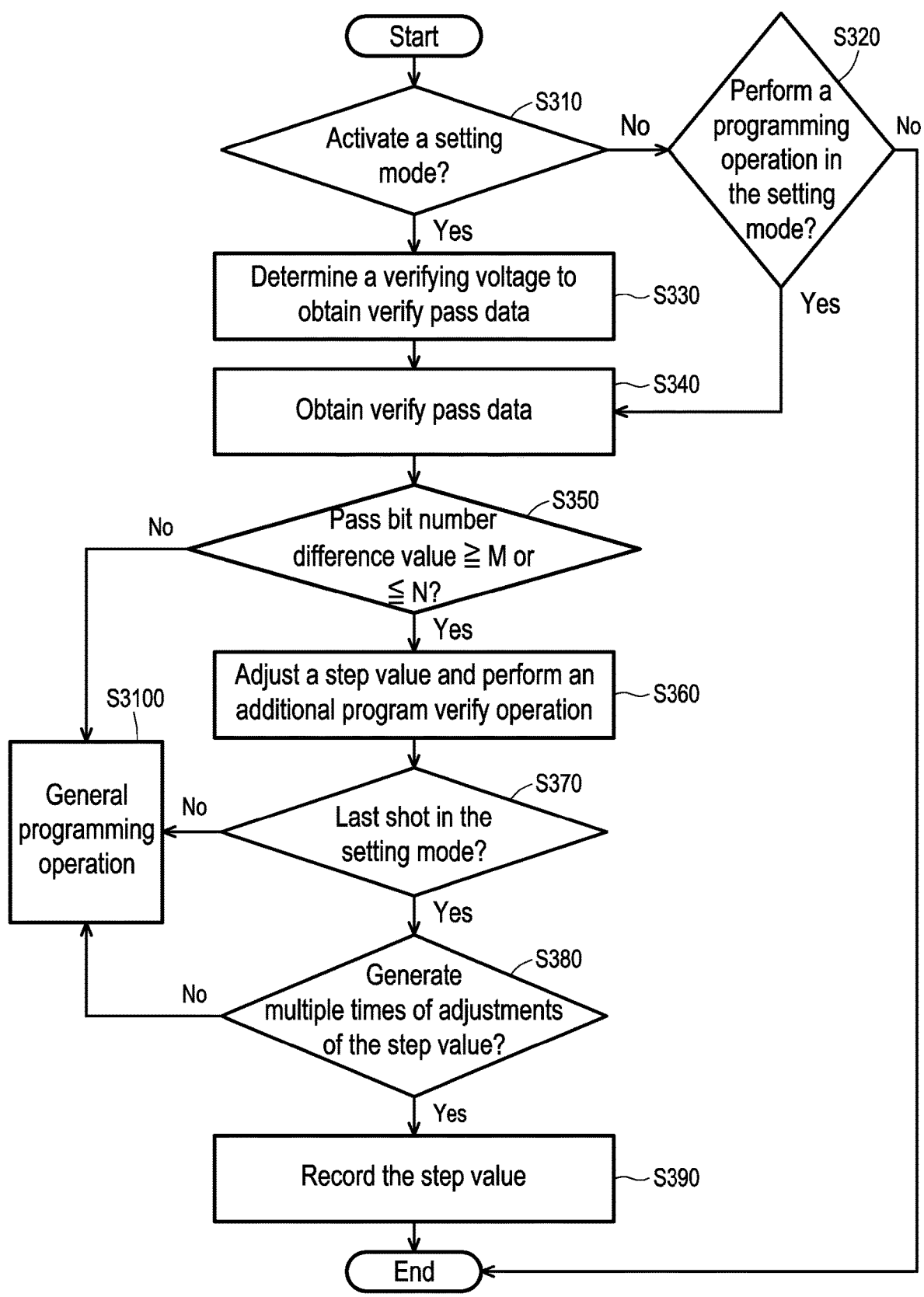
FIG. 3 is a flowchart of a programming operation of a memory device according to an embodiment of the disclosure.

Please refer to FIG. 3 below. FIG. 3 is a flowchart of a programming operation of a memory device according to an embodiment of the disclosure. In Step S310, in the programming operation, whether the setting mode is activated for each shot is judged. If Step S310 judges that the setting mode is not activated for each shot, Step S320 may be performed to judge whether to perform the setting mode for a specific shot. When the judging operation of Step S310 is yes, Step S330 may be performed. When the judging operation of Step S320 is yes, Step S340 may be performed, and when the judging operation of Step S320 is no, the process may be ended.

It can be known here that in the programming operation of the embodiment of the disclosure, there may be various selections for the activation timing of the setting mode. For example, the setting mode may be activated each time (shot) in the programming operation or the setting mode may also be activated in a specific programming operation, and there is no particular limitation.

In Step S330, the verifying voltage may be determined, and the program verify operation may be performed for the memory cells after the programming operation according to the verifying voltage, so as to generate verify pass data in Step S340. Next, the pass bit number may be generated according to the verify pass data, and in Step S350, the pass bit number may be compared with a first threshold value M and a second threshold value N, and whether the pass bit number is greater than or equal to the first threshold value M, or less than or equal to the second threshold value N may be judged. If the judging result of Step S350 is no, Step S3100 may be performed to maintain the step value to perform a general programming operation. If the judging result of Step S350 is yes, Step S360 is performed to adjust the step value and perform an additional program verify operation.

In Step S370, in the programming operation, whether it is the last shot in the setting mode is judged. If the judging result is yes, Step S380 is performed. On the contrary, if the judging result is no, Step S3100 is performed.

In Step S380, whether there are multiple (two or more) adjustment operations of the step value during a process of multiple programming operations is judged. If the judging result is yes, Step S390 may be performed and the adjusted step value may be recorded. If the judging result is no, Step S3100 is performed.

It should be noted that the adjusted step value recorded in Step S390 may be read as the setting basis of the step value when the programming operation of a next selected memory page is performed. The next selected memory page and the selected memory page of the present programming operation may be the same memory block and share multiple same word lines.

Figure 4B:
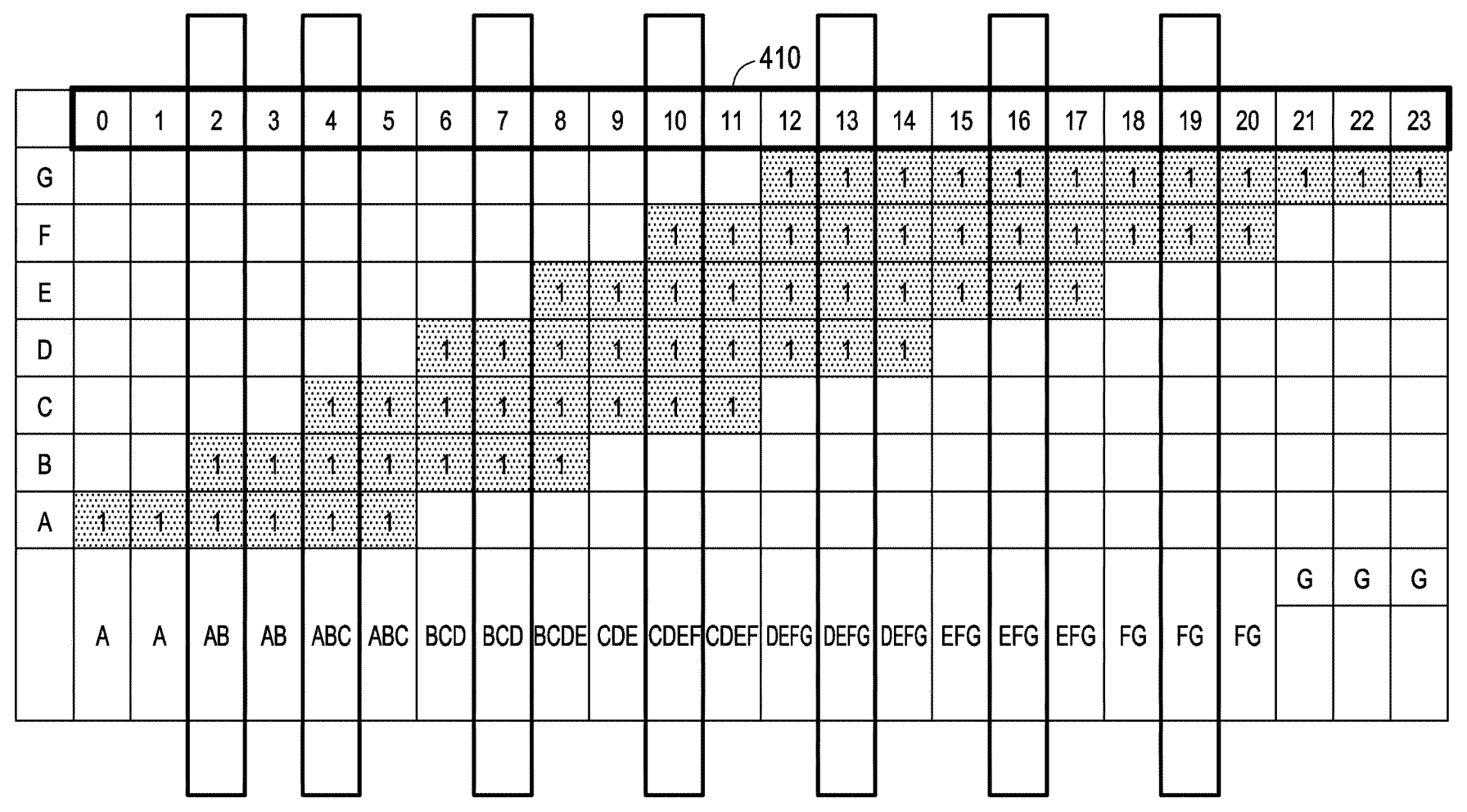
Figure 4C:
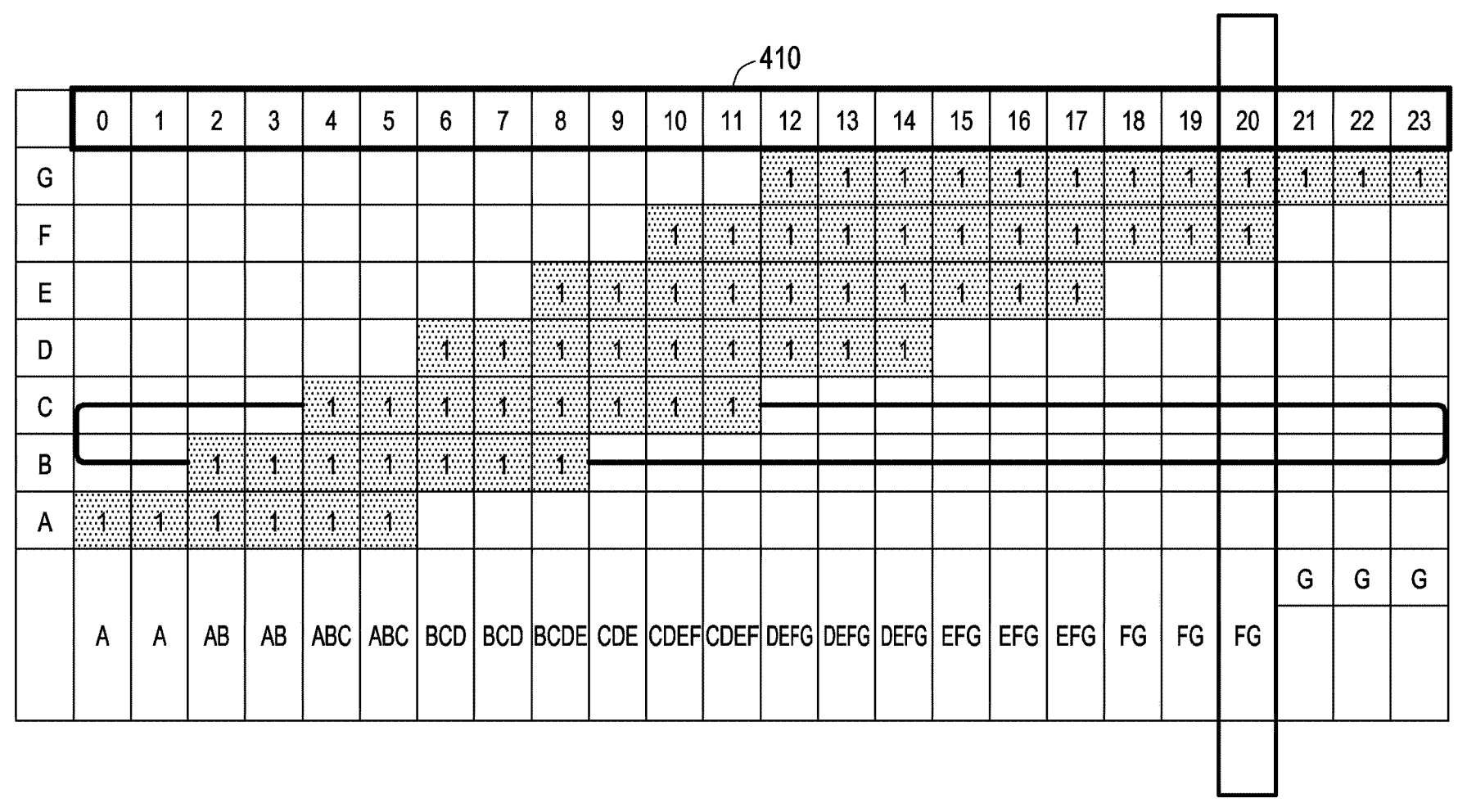

Please refer to FIG. 4A, FIG. 4B and FIG. 4C below. FIG. 4A to FIG. 4C are diagrams of a relationship between a programming operation and a program verify operation according to an embodiment of the disclosure. In the embodiment, the program verify operations may be divided into multiple groups according to a cumulative number 410 of the programming operations, and one or more verifying voltages corresponding to the groups are set. Corresponding to the cumulative number 410, the program verify operations corresponding to the programming operations from the 0th shot to the 1st shot may be performed through a verifying voltage A; the program verify operations corresponding to the programming operations from the 2nd shot to the 3rd shot may be performed through verifying voltages A and B; the program verify operations corresponding to the programming operations from the 4th shot to the 5th shot may be performed through verifying voltages A, B, and C; the program verify operations corresponding to the programming operations from the 6th shot to the 7th shot may be performed through verifying voltages B, C, and D; the program verify operation corresponding to the programming operation of the 8th shot may be performed through verifying voltages B, C, D, and E; . . . ; the program verify operations corresponding to the programming operations from the 15th shot to the 17th shot may be performed through verifying voltages E, F, and G; the program verify operations corresponding to the programming operations from the 18th shot to the 20th shot may be performed through the verifying voltages F and G; the program verify operations corresponding to the programming operations from the 21st shot to the 23rd shot may be performed through the verifying voltage G.

In the embodiment, in the case where the setting mode is activated for each shot, according to FIG. 4A, the verifying voltage A may be enabled (corresponding to logic "1" in FIG. 4A) after the programming operations from the 0th shot to the 5th shot (the 0th shot to the 5th shot may be a first group) to perform the program verify operations; the verifying voltage B may be enabled after the programming operations from the 2nd shot to the 8th shot (the 2nd shot to the 8th shot may be a second group) to perform the program verify operations; and the verifying voltage C may be enabled after the programming operations from the 4th shot to the 11th shot (the 4th shot to the 11th may be a third group) to perform the program verify operations. The remaining verifying voltages C to G may be enabled at appropriate times according to FIG. 4 to perform the program verify operations.

The selection of enabling the verifying voltages A to G may be performed by a logic operation through a controller in the memory device.

In addition, in the setting mode, the pass bit number generated in the program verify operation corresponding to each shot needs to be calculated, and the pass bit number difference value between the two pass bit numbers is calculated. According to the pass bit number difference value, the step value in the incremental step pulse programming scheme may be adjusted correspondingly.

The relationship between the adjusting manner of the step value and the pass bit number difference value is described in detail in the foregoing embodiment and will not be repeated.

On the other hand, in the embodiment, in the case where the setting mode is not activated for each shot, the setting mode may be activated for a specific shot. For example, the setting mode may be activated for the programming operations selected corresponding to the last N shots in each group, where N is a positive integer. In FIG. 4A, for the 0th shot to the 5th shot corresponding to the first group, the setting mode may be activated in the last 5th shot (N=1), the 4th shot to the 5th shot (N=2), or the 3rd shot to the 5th shot (N=3). Thereby, the number of logical computations performed by the controller can be reduced, and the power requirement can be reduced.

Of course, the specific shot for activating the setting mode may also be set by the designer. The designer may select multiple selected programming operations among all the programming operations according to actual requirements, and activate the setting mode when the selected programming operations are performed. As FIG. 4B shows, the designer may choice to activate the setting mode at the 2nd, 4th, 7th, 10th, 13th, 16th and 19th shots.

In FIG. 4C, when the programming operation of 20th shot has been complete, based on the programming operation has been processed to a last one verifying voltage G, more latches can be released for storing data generated by the programming operation of 20th shot. Such as that, in present embodiment, an XOR operation can be perform on pass bit numbers of 21th shot and 23th shot which are not adjacent to calculate a pass bit number difference value, and the step value of the incremental step pulse programming scheme can be adjuster according to the pass bit number difference value. For performing programming operation on a word line group of a next memory page, when the pass bit number difference value is larger than or equal to a preset first threshold value, the step value can be increased; when the pass bit number difference value is smaller than or equal to a preset second threshold value, the step value can be decreased; and when the pass bit number difference value is smaller than the first threshold value and larger than the second threshold value, the step value is not adjusted, where the first threshold value is larger than the second value.

It should be noted here, in present embodiment, if the program operation should be executed to 24th or more shot, the pass bit number difference value can be obtained by performing the XOR operation on the pass bit numbers of the 21th shot and the 24th (or later) shot, and the step value can be adjusted (or not adjusted) according to the difference value.

Figure 5:
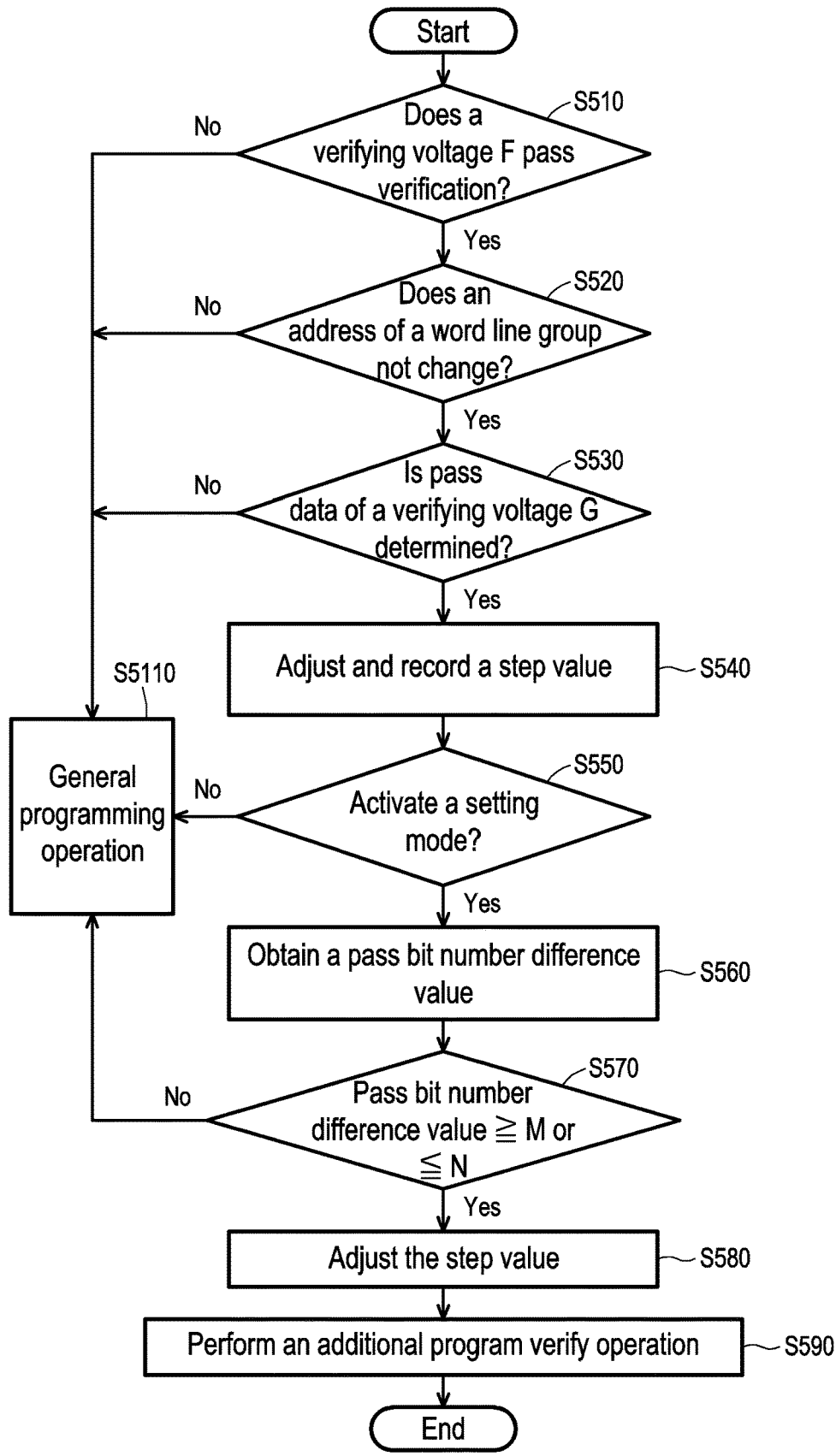
FIG. 5 is a flowchart of a programming operation of a memory device according to another embodiment of the disclosure.

Please refer to FIG. 5 below. FIG. 5 is a flowchart of a programming operation of a memory device according to another embodiment of the disclosure. Please refer to FIG. 4 at the same time. In Step S510, whether the program verify operation corresponding to the verifying voltage F passes is judged. If the program verify operation corresponding to the verifying voltage F passes, Step S520 may be performed. On the contrary, if the program verify operation corresponding to the verifying voltage F does not pass, Step S5110 may be performed to perform the general programming operation.

Step S520 is used to judge whether an address of a word line group changes. If the address of the word line group changes, Step S5110 is performed. If the address of the word line group does not change, Step S530 may be performed. Step S530 is used to judge whether pass data of the verifying voltage G is determined. If yes, Step S540 may be performed to adjust the step value and record the adjusted step value. If not, Step S5110 may be performed.

In Step S550, whether the setting mode is activated may be judged. When the setting mode is activated, Step S560 may be performed. If the setting mode is not activated, Step S5110 may be performed.

Step S560 is used to obtain the pass bit number difference value through the program verify operation. Then, in Step S570, the pass bit number difference value may be compared with the first threshold value M and the second threshold value N. When the pass bit number difference value is not less than the first threshold value M or not greater than the second threshold value N, the adjustment operation of the step value may be performed in Step S580, and the additional program verify operation may be performed in Step S590. If the pass bit number difference value is less than the first threshold value M and greater than the second threshold value N, Step S5110 is performed.

Figure 6:
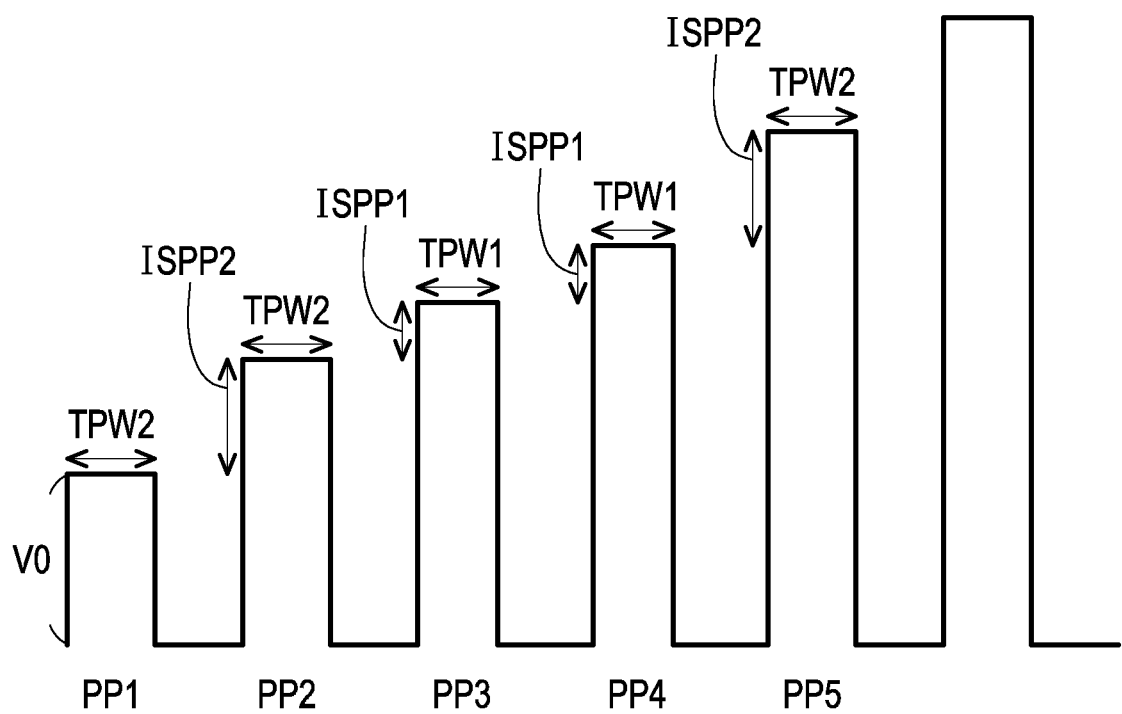
FIG. 6 is a schematic diagram of a waveform of a programming voltage pulse of a programming operation of a memory device according to an embodiment of the disclosure.

Please refer to FIG. 6. FIG. 6 is a schematic diagram of a waveform of a programming voltage pulse of a programming operation of a memory device according to an embodiment of the disclosure. A programming voltage pulse PP1 corresponding to a first programming operation (the first shot) may have a voltage V0 and a pulse width TPW2. Next, based on a step value ISPP2, a programming voltage pulse PP2 corresponding to a second programming operation (the second shot) may have a voltage value equal to V0+ISPP2 and the same pulse width TPW2 as the programming voltage pulse PP1.

Next, through calculating the pass bit number difference value generated between the first programming operation and the second programming operation, and when the pass bit number difference value is judged to be greater than the first threshold value, the step value ISPP2 may be decreased to a step value ISPP1, and a programming voltage pulse PP3 corresponding to a third programming operation (the third shot) is generated according to the step value ISPP1.

It is worth mentioning that during the operation of decreasing the step value ISPP2 to the step value ISPP1, the width of the programming voltage pulse PP3 may also be synchronously decreased to a width TPW1.

Then, through calculating the pass bit number difference value generated between the second programming operation and the third programming operation, and when the pass bit number difference value is judged to be between the first threshold value and the second threshold value, the step value ISPP1 and the width TPW1 both remain unadjusted, and a programming voltage pulse PP4 corresponding to a fourth programming operation (the fourth shot) is generated according to the step value ISPP1 and the width TPW1.

Then, through calculating the pass bit number difference value generated between the third programming operation and the fourth programming operation, and when the pass bit number difference value is judged to be less than the second threshold value, the step value ISPP1 is increased to the step value ISPP2, the width TPW1 is synchronously increased to TPW2, and a programming voltage pulse PP5 corresponding to a fifth programming operation (a fifth shot) is generated according to the step value ISPP2 and the width TPW2.

It is not difficult to find here that the energy of the programming voltage pulse in the embodiment may be adaptively adjusted according to the dynamic characteristics of the memory cells during the programming process, which can effectively optimize the programming performance of the memory cells. On the premise of taking into account the distribution concentration of the threshold voltage of the programmed memory cells, the time required for the programming operation can be shortened.

Figure 7:
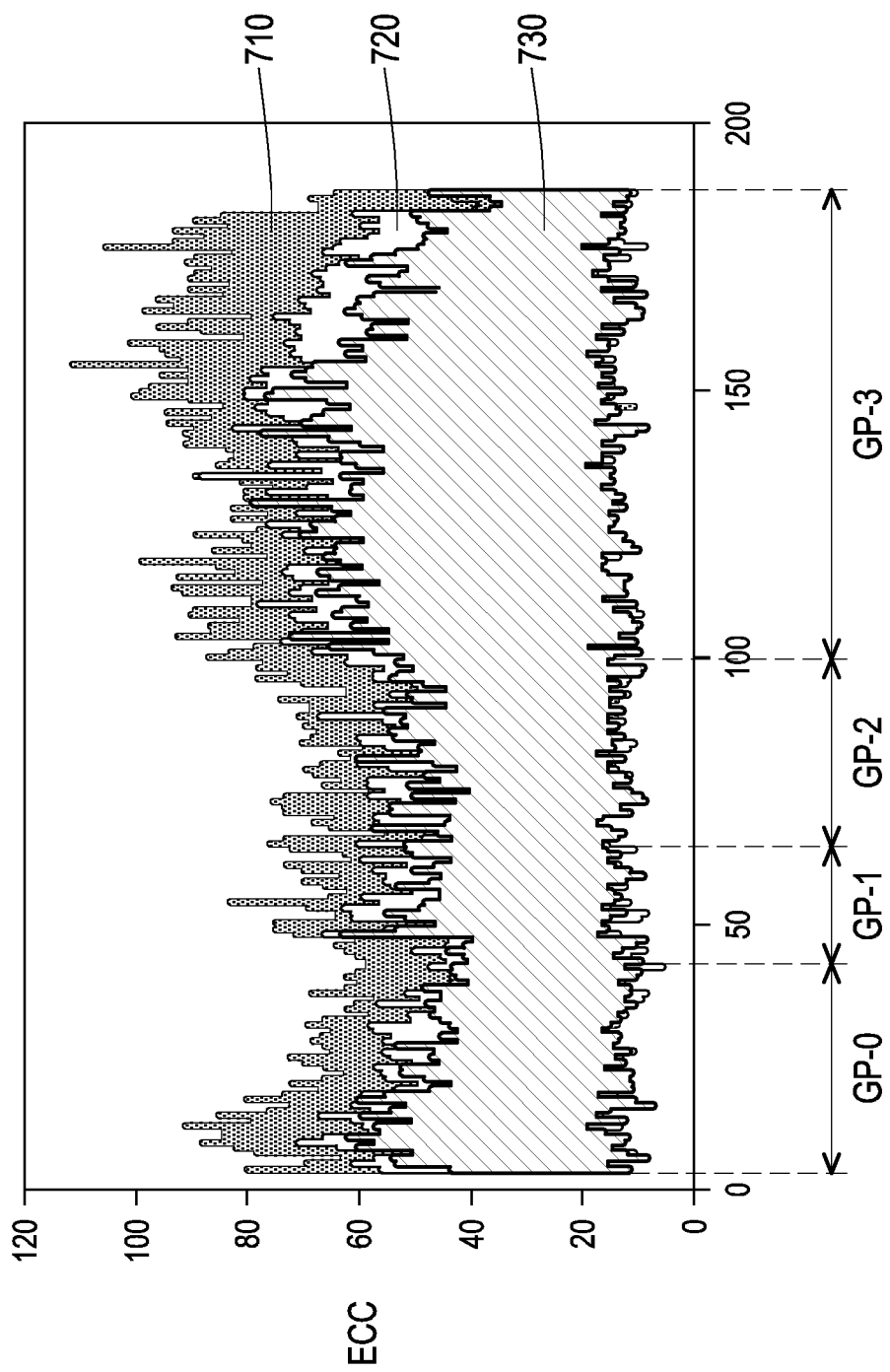
FIG. 7 is a schematic diagram of reliability of programming operations performed corresponding to different memory cell groups according to an embodiment of the disclosure.

Please refer to FIG. 7 below. FIG. 7 is a schematic diagram of reliability of programming operations performed corresponding to different memory cell groups according to an embodiment of the disclosure. In FIG. 7, the vertical axis represents the bit number of the required error correction code and the horizontal axis represents the corresponding word line. According to the different corresponding word lines, the memory cells may be divided into multiple groups GP-0 to GP-3, wherein the group GP-0 corresponds to word lines WL0 to WL5; the group GP-1 corresponds to word lines WL6 to WL11; the group GP-2 corresponds to word lines WL12 to WL17; and the group GP-3 corresponds to word lines WL18 to WL23. Through the programming method of the embodiment of the disclosure, the programming operation is performed on the memory cells of the group GP-0 to obtain that the adjusted step value ISPP1=0.35 volts; the programming operation is performed on the memory cells of the group GP-1 to obtain that the adjusted step value ISPP2=0.45 volts; the programming operation is performed on the memory cells of the group GP-2 to obtain that an adjusted step value ISPP3=0.45 volts; and the programming operation is performed on the memory cells of the group GP-3 to obtain that the adjusted step value ISPP2=0.45 volts.

In addition, regions 710 to 730 respectively correspond to relationship diagrams of the bit numbers of the error correction codes required for memory data corresponding to different word lines after the programming operations are performed on the memory cells of the erase operations under different conditions. It can be clearly found from FIG. 7 that through the adjustment operation of the step value of the embodiment of the disclosure, the reliability of the memory data can be maintained to have a certain uniformity.

Figure 8:
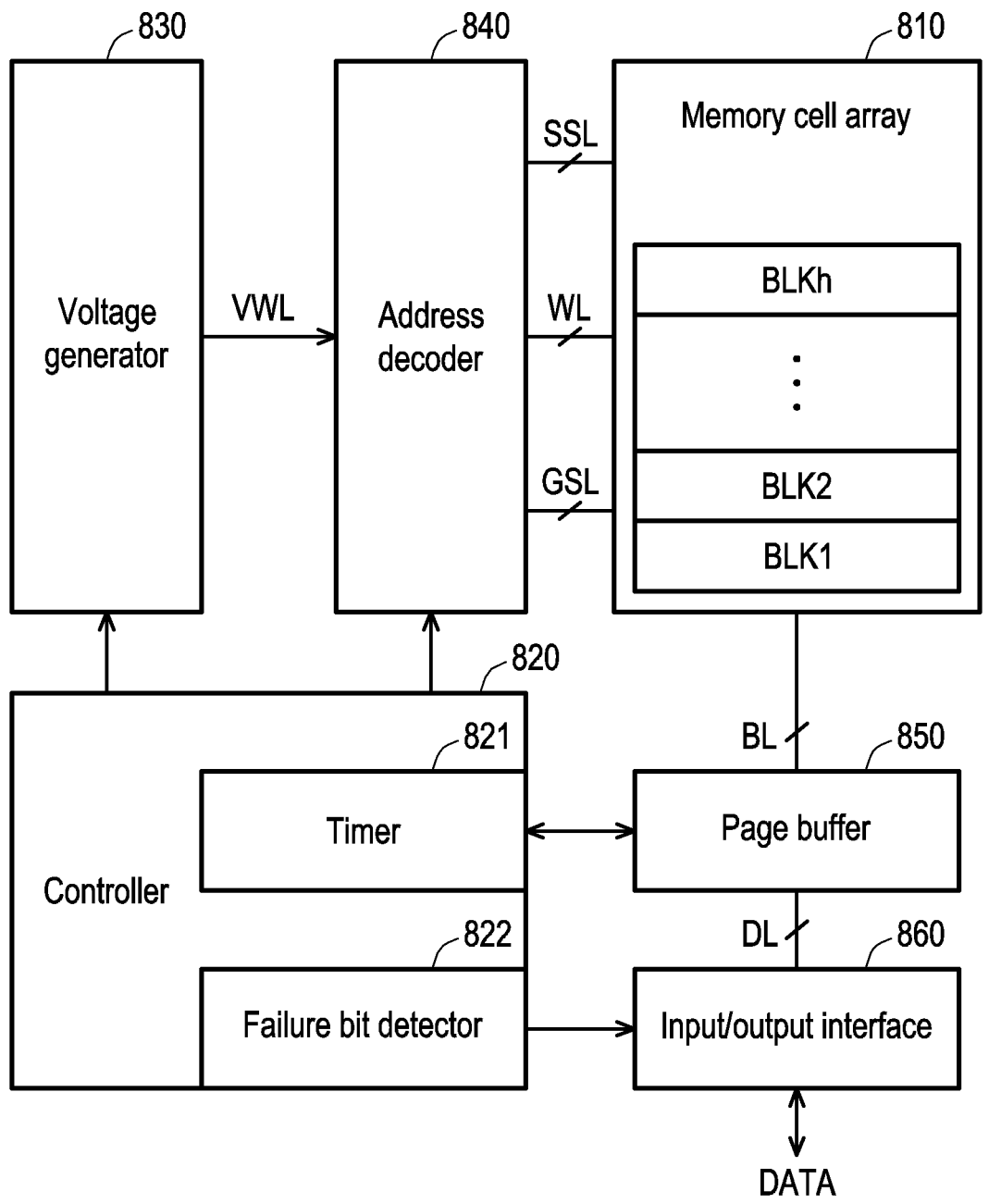
FIG. 8 is a schematic diagram of a memory device according to an embodiment of the disclosure.

Please refer to FIG. 8. FIG. 8 is a schematic diagram of a memory device according to an embodiment of the disclosure. A memory device 800 includes a memory cell array 810, a controller 820, a voltage generator 830, an address decoder 840, a page buffer 850, and an input/output interface 860. The memory cell array 810 may be a flash memory cell array and includes multiple memory blocks BLK1 to BLKh. Each of the memory blocks BLK1 to BLKh may have multiple memory pages.

The voltage generator 830 is coupled to the controller 820 and the address decoder 840, and the voltage generator 830 generates a reference voltage VWL according to the step value. The address decoder 840 is coupled to the controller 820 and the memory cell array 810. The address decoder 840 may generate selection signals GSL and SSL to the selected memory page according to address information, and multiple word line voltages WL are sequentially generated to the selected memory page according to the reference voltage VWL to perform the programming operations. The page buffer 850 may be coupled to the controller 820 and a bit line BL of the memory cell array 810, and is used to provide multiple read data corresponding to the program verify operations to the controller 820.

The controller 820 includes a timer 821 and a failure bit detector 822. The failure bit detector 822 may calculate a failure bit count (FBC) in the program verify operation according to the read data provided by the page buffer 850. Through the failure bit count, the controller 820 may further calculate the pass bit number of the program verify operations.

It is worth mentioning that in the program verify operations of multiple verifying voltages (such as the verifying voltage A and the verifying voltage B), the failure bit detector 822 may first calculate the failure bit count in the program verify operation corresponding to the verifying voltage A, and record the failure bit count corresponding to the verifying voltage A in a register. Next, the failure bit detector 822 may calculate the failure bit count in the program verify operation corresponding to the verifying voltage B, and record the failure bit count corresponding to the verifying voltage B in another register. Next, it is worth noting that the failure bit detector 822 may perform a calculation operation of the pass bit number, and the performing time thereof may overlap with the next programming operation without requiring additional time. In this way, in the embodiment of the disclosure, only one failure bit detector 822 needs to be disposed in the controller 820.

The controller 820 may temporarily store the pass bit number of the program verify operations, and subtract the two pass bit numbers to generate the pass bit number difference value. Further, the pass bit number difference value is compared with the preset first threshold value and second threshold value, whether to adjust the step value is then determined through the comparison result, and the voltage generator 830 adjusts the generated reference voltage VWL according to the step value.

In addition, the timer 821 may be used to determine the width of the programming voltage pulse. In other words, the timer 821 may also synchronously adjust the width of the programming voltage pulse according to an adjustment mechanism of the step value.

The timer 821 and the failure bit detector 822 may be both implemented by applying analog or digital circuits known to persons skilled in the art, and there is no particular limitation.

The input/output interface 860 is coupled to the page buffer 850 through a data line DL and is used to receive and send signal DATA.

In summary, when the memory device of the disclosure performs the programming operation, through calculating the pass bit number difference value between the two pass bit numbers corresponding to the two programming operations, the adjustment operation of the step value is performed. In this way, the memory device of the disclosure can optimize the programming operations of the memory cells by simple logical operations, and on the premise of taking into account the density of the threshold voltage distribution of the memory cells and reducing complexity of the operations of the circuit, the programming speed can be effectively improved.

What is claimed is:

1. A programming method, applicable to a memory device, comprising:
   according to a step value, based on an incremental step pulse programming scheme, performing a plurality of programming operations for a selected memory page;
   in a setting mode, respectively performing a plurality of program verify operations corresponding to the programming operations to respectively generate a plurality of pass bit numbers;
   in the setting mode, calculating a pass bit number difference value of two pass bit numbers corresponding to two programming operations; and
   in the setting mode, adjusting an amount of the step value of the incremental step pulse programming scheme according to the pass bit number difference value.

2. The programming method according to claim 1, wherein a step of adjusting the amount of the step value according to the pass bit number difference value comprises:
   when the pass bit number difference value is greater than a first threshold value, decreasing the step value.

3. The programming method according to claim 2, wherein the step of adjusting the amount of the step value according to the pass bit number difference value comprises:
   when the pass bit number difference value is less than a second threshold value, increasing the step value,
   wherein the first threshold value is greater than the second threshold value.

4. The programming method according to claim 3, wherein the step of adjusting the amount of the step value according to the pass bit number difference value comprises:
   when the pass bit number difference value is smaller than the first threshold value and larger than the second threshold value, the step value is kept and not adjusted.

5. The programming method according to claim 1, further comprising:
   calculating a cumulative number of the programming operations; and
   setting at least one verifying voltage corresponding to each of the program verify operations according to the cumulative number.

6. The programming method according to claim 5, further comprising:
   dividing the corresponding programming operations into a plurality of groups according to the cumulative number, wherein each of the groups comprises at least one of the programming operations; and
   in each of the groups, activating the setting mode when corresponding to the at least one of the programming operations of last N shots, where N is a positive integer.

7. The programming method according to claim 1, further comprising:
   selecting a plurality of selected programming operations among the programming operations, and when the selected programming operations are performed, activating the setting mode.

8. The programming method according to claim 1, wherein the step of adjusting a width of a programming pulse corresponding to each of the programming operations according to the pass bit number difference value comprises:

in the setting mode, adjusting the width of the programming pulse corresponding to each of the programming operations according to the pass bit number difference value;

when the pass bit number difference value is greater than a first threshold value, decreasing the width of the programming pulse; and when the pass bit number difference value is less than a second threshold value, increasing the width of the programming pulse, wherein the first threshold value is greater than the second threshold value.

9. The programming method according to claim 1, further comprising:

recording the adjusted step value; and reading the adjusted step value in a record, and programming another selected memory page according to the adjusted step value, wherein the selected memory page and the another selected memory page share a plurality of same word lines.

10. A memory device, comprising:

a memory cell array, comprising a plurality of memory blocks, wherein each of the memory blocks has a plurality of memory pages; and a controller, coupled to the memory cell array and used to:

according to a step value, based on an incremental step pulse programming scheme, perform a plurality of programming operations for a selected memory page;

in a setting mode, respectively perform a plurality of program verify operations corresponding to the programming operations to respectively generate a plurality of pass bit numbers;

in the setting mode, calculate a pass bit number difference value of two pass bit numbers corresponding to two programming operations; and in the setting mode, adjust an amount of the step value according to the pass bit number difference value, wherein the controller comprises:

a timer, used to set a width of a programming pulse of each of the programming operations; and a failure bit detector, generating the pass bit numbers corresponding to the program verify operations according to a plurality of read data corresponding to the program verify operations.

11. The memory device according to claim 10, wherein the controller is further used to:

when the pass bit number difference value is greater than a first threshold value, decrease the step value.

12. The memory device according to claim 11, wherein the controller is further used to:

when the pass bit number difference value is less than a second threshold value, increase the step value, wherein the first threshold value is greater than the second threshold value.

13. The memory device according to claim 12, wherein the controller is further used to:

when the pass bit number difference value is smaller than the first threshold value and larger than the second threshold value, the step value is kept and not adjusted.

14. The memory device according to claim 10, wherein the controller is further used to:

calculate a cumulative number of the programming operations;

set at least one verifying voltage corresponding to each of the program verify operations according to the cumulative number;

divide the corresponding programming operations into a plurality of groups according to the cumulative number, wherein each of the groups comprises at least one of the programming operations; and in each of the groups, activate the setting mode when corresponding to the at least one of the programming operations of last N shots, where N is a positive integer.

15. The memory device according to claim 10, wherein the controller is further used to:

select a plurality of selected programming operations among the programming operations, and when the selected programming operations are performed, activate the setting mode.

16. The memory device according to claim 10, wherein the controller is further used to:

in the setting mode, adjust the width of the programming pulse corresponding to each of the programming operations according to the pass bit number difference value;

when the pass bit number difference value is greater than a first threshold value, decrease the width of the programming pulse; and when the pass bit number difference value is less than a second threshold value, increase the width of the programming pulse, wherein the first threshold value is greater than the second threshold value.

17. The memory device according to claim 10, wherein the controller is further used to:

record the adjusted step value; and read the adjusted step value in a record, and program another selected memory page according to the adjusted step value.

18. The memory device according to claim 17, wherein the selected memory page and the another selected memory page share a plurality of same word lines.

19. The memory device according to claim 10, further comprising:

a voltage generator, coupled to the controller and generating a reference voltage according to the step value; and an address decoder, coupled between the memory cell array and the voltage generator, and based on address information, sequentially generate a plurality of word line voltages to the selected memory page according to the reference voltage to perform the programming operations; and a page buffer, coupled to the controller and the memory cell array, and used to provide the plurality of read data corresponding to the program verify operations.

* * * * *